United States Patent
Kishimoto et al.

(10) Patent No.: US 7,285,727 B2
(45) Date of Patent: Oct. 23, 2007

(54) FLEXIBLE WIRING BOARDS FOR DOUBLE-SIDE CONNECTION

(75) Inventors: Soichiro Kishimoto, Tochigi (JP); Yukio Anzai, Tochigi (JP); Osamu Keino, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 201 days.

(21) Appl. No.: 10/360,939

(22) Filed: Feb. 10, 2003

(65) Prior Publication Data

US 2003/0136578 A1 Jul. 24, 2003

Related U.S. Application Data

(63) Continuation of application No. PCT/JP01/06693, filed on Aug. 3, 2001.

(30) Foreign Application Priority Data

Aug. 10, 2000 (JP) .............................. 2000-242578

(51) Int. Cl.
  *H05K 1/16* (2006.01)
  *H01K 3/10* (2006.01)
(52) U.S. Cl. ........................ 174/260; 29/852; 29/853
(58) Field of Classification Search ........ 174/262–266, 174/259; 29/852, 853
See application file for complete search history.

(56) References Cited

U.S. PATENT DOCUMENTS

| | | | | |
|---|---|---|---|---|
| 5,029,985 A | * | 7/1991 | Suzuki et al. ................ | 349/74 |
| 5,774,340 A | * | 6/1998 | Chang et al. ................ | 361/771 |
| 5,781,264 A | * | 7/1998 | Noda et al. .................. | 349/150 |
| 5,800,650 A | * | 9/1998 | Anderson et al. ............ | 156/150 |
| 5,909,615 A | * | 6/1999 | Kuo ............................. | 438/157 |
| 6,000,130 A | * | 12/1999 | Chang et al. ................ | 29/852 |
| 6,472,610 B1 | * | 10/2002 | Kawabata .................... | 174/260 |
| 6,608,663 B2 | * | 8/2003 | Sakamoto et al. .......... | 349/149 |
| 6,780,493 B2 | * | 8/2004 | Noda et al. .................. | 428/209 |
| 6,962,829 B2 | * | 11/2005 | Glenn et al. ................. | 438/33 |

FOREIGN PATENT DOCUMENTS

| | | |
|---|---|---|
| EP | 0 993 039 A1 | 4/2000 |
| JP | 4-87673 | 7/1992 |
| JP | U 4-87673 | 7/1992 |
| JP | A 5-259646 | 10/1993 |
| JP | A 6-61419 | 3/1994 |
| JP | A 9-46042 | 2/1997 |
| JP | 09-148698 | 6/1997 |
| JP | A 11-17056 | 1/1999 |
| JP | 11-040293 | 2/1999 |
| JP | A 11-195849 | 7/1999 |
| JP | 2000-058158 | 2/2000 |
| JP | 2000-243489 | 9/2000 |
| JP | 2001-283996 | 10/2001 |

* cited by examiner

*Primary Examiner*—Jeremy C. Norris
(74) *Attorney, Agent, or Firm*—Oliff & Berridge, PLC

(57) ABSTRACT

A flexible wiring board for double side connection is capable of improving the reliability of connection to circuit boards and a manufacturing process thereof. The flexible wiring board for double-side connection includes a polyimide film having a through-hole at a given location and first and second electrodes, one of which is provided on each side of the polyimide film. The second electrode closes one end of the through-hole in the polyimide film, such that any anisotropic adhesive used to connect an electric component to the first electrode will not flow through the through-hole to the other side of the polyimide film. The first and second electrodes are electrically connected each other by a plating layer.

6 Claims, 4 Drawing Sheets

FLEXIBLE WIRING BOARDS FOR DOUBLE-SIDE CONNECTION

TECHNICAL FIELD

The present invention relates to double-sided flexible wiring boards for example, electrically connecting a liquid crystal panel and a circuit board, and manufacturing processes thereof.

BACKGROUND ART

A conventional means for electrically connecting a liquid crystal panel and a circuit board involves mechanically bonding an electrode formed on the liquid crystal panel and a contact formed on the circuit board under pressure with an anisotropic conductive rubber inserted therebetween.

In recent years, double-sided flexible wiring boards having a through-hole have been used in place of anisotropic conductive rubbers in order to improve the reliability of the connection between connecting terminals of liquid crystal panels and circuit boards.

FIG. 4 is a sectional diagram showing the main structure of a conventional flexible wiring board for double-side connection.

As shown in FIG. 4, this flexible wiring board for double-side connection 101 has a through-hole 102a formed at a given location in an insulating substrate 102 made from for example polyimide. Electrodes 121, 122 are formed on both sides of the insulating substrate 102, and these electrodes 121, 122 are connected to each other by a plating layer 103 applied via through-hole 102a.

Such a double-sided flexible wiring board 101 can be bonded to a liquid crystal panel using an anisotropic conductive adhesive or an anisotropic conductive adhesive film with a higher connection reliability than obtained by the connecting means based on rubber and pressure, described above.

However, such a conventional flexible wiring boards for double-side connection 101 have the following problems.

As shown in FIGS. 5a and 5b, such a conventional flexible wiring board for double-side connection 101 has the problem that anisotropic conductive adhesive 104 runs off to the opposite side via through-hole 102a during thermocompression bonding to a liquid crystal panel 108, comprising a glass substrate 106 having an electrode pattern 107 formed thereon, for example, to cause smoothness loss or contamination. As a result, the reliability of the connection to other circuit boards is lowered.

The present invention was made to solve these problems of the prior art with the purpose of providing a flexible wiring board for double-side connection capable of improving the reliability of connection to circuit boards and a manufacturing process thereof.

DISCLOSURE OF THE INVENTION

The present invention provides a flexible wiring board for double-side connection comprising a film-shaped insulating substrate having a through-hole at a given location, and a pair of first and second electrodes provided on both sides of the insulating substrate and electrically connected each other with the through-hole in the insulating substrate being closed.

In the flexible wiring board for double-side connection of the present invention, the through-hole in the insulating substrate may be closed with one of the pair of first and second electrodes and the pair of first and second electrodes may be electrically connected each other by plating.

In the flexible wiring board for double-side connection of the present invention, an anisotropic conductive adhesive film may be applied on the side of an opening of the through-hole in the insulating substrate.

The present invention also provides an electric component assembly consisting of a plurality of components comprising an electric component having a given electrode, and a flexible wiring board for double-side connection comprising a film-shaped insulating substrate having a through-hole at a given location and a pair of first and second electrodes provided on both sides of the insulating substrate and electrically connected each other with the through-hole in the insulating substrate being closed, wherein the electric component and the flexible wiring board for double-side connection are electrically connected and bonded to each other with an anisotropic conductive adhesive.

In the electric component assembly of the present invention, the through-hole in the insulating substrate may be closed with one of the pair of first and second electrodes, and the pair of first and second electrodes may be electrically connected each other by plating.

The present invention also provides an electric component assembly comprising a liquid crystal panel having a given electrode, and a flexible wiring board for double-side connection comprising a film-shaped insulating substrate having a through-hole at a given location, and a pair of first and second electrodes provided on both sides of the insulating substrate and electrically connected to each other with the through-hole in the insulating substrate being closed, wherein the liquid crystal panel and the flexible wiring board for double-side connection are electrically connected and bonded each other with an anisotropic conductive adhesive.

The present invention also provides an electric component assembly comprising an electric component having a given electrode, a flexible wiring board for double-side connection comprising a film-shaped insulating substrate having a through-hole at a given location and a pair of first and second electrodes provided on both sides of the insulating substrate and electrically connected to each other with the through-hole in the insulating substrate being closed, and a circuit board mounting a given electronic component, wherein the electric component and the flexible wiring board for double-side connection are electrically connected and bonded each other with an anisotropic conductive adhesive, and the flexible wiring board for double-side connection and the circuit board are electrically connected and bonded to each other with an anisotropic conductive adhesive.

In the electric component assembly of the present invention, the electric component may be a liquid crystal panel.

The present invention also provides a process for manufacturing a flexible wiring board for double-side connection comprising the steps of etching a given part of one of the metal foils in a laminate formed of a film-shaped insulating substrate having the metal foils on both sides to form a hole, etching the part of the insulating substrate corresponding to the hole in the metal foil to form a through-hole, applying a plating layer on the one metal foil and the through-hole in the insulating substrate to electrically connect the pair of metal foils each other; and etching the pair of metal foils to form a given pattern.

In the case of the flexible wiring boards for double-side connection of the present invention, a pair of first and second electrodes provided on both sides of an insulating substrate are electrically connected each other with at least one end of a through-hole in the insulating substrate being closed to solve the problem that when an anisotropic conductive adhesive is used to connect one electrode to an electrode of another electric component, the anisotropic conductive adhesive runs off to the side of the other electrode to cause smoothness loss or contamination during connection to other circuit boards.

In this case, a flexible wiring board for double-side connection can be easily manufactured especially when the through-hole in the insulating substrate is closed with one of a pair of first and second electrodes and the pair of first and second electrodes are electrically connected each other by plating.

According to the present invention having such a structure, not only can electric component assemblies with a high reliability of connection to circuit boards be obtained, but also the reliability of connection between circuit boards during manufacturing of liquid crystal display devices, for example, can be improved.

According to the manufacturing process of the present invention, a flexible wiring board for double-side connection of the present invention can be easily and efficiently manufactured.

Figure 1A:
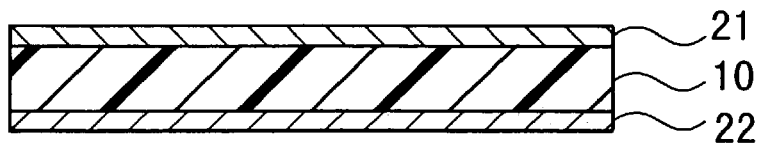
FIGS. 1a-1e are a flow diagram showing a process for manufacturing a flexible wiring board according to an embodiment of the present invention.

Various references in the drawings represent the following elements: 1, laminate; 3, insulating adhesive; 4, conductive particles; 5, anisotropic conductive adhesive film; 6, glass substrate; 7, electrode pattern; 8, liquid crystal panel (electric component); 10, polyimide film (insulating substrate); 10a, through-hole; 21, first copper foil (metal foil); 22, second copper foil (metal foil); 23, plating layer; 30, flexible wiring board for double-side connection; 31, first electrode; 32, second electrode; 40, electronic component assembly; 50, circuit board; 60, electronic component assembly.

THE MOST PREFERRED EMBODIMENTS OF THE INVENTION

A preferred embodiment of a flexible wiring board for double-side connection of the present invention is explained in detail below with reference to the attached drawings.

FIGS. 1a-1e are a flow diagram showing a process for manufacturing a flexible wiring board according to an embodiment of the present invention.

As shown in FIG. 1a, a laminate 1, comprising a polyimide film (insulating substrate) 10, having first and second copper foils (metal foils) 21, 22 on both sides is first prepared, for example.

Figure 1B:
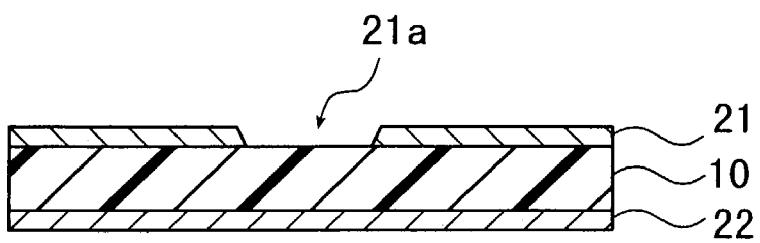

Then, as shown in FIG. 1b, a hole 21a is formed at a given location in the first copper foil 21 by etching with an etchant such as cupric chloride, persulfates, ferric chloride or copper-ammine complexes, for example.

Figure 1C:
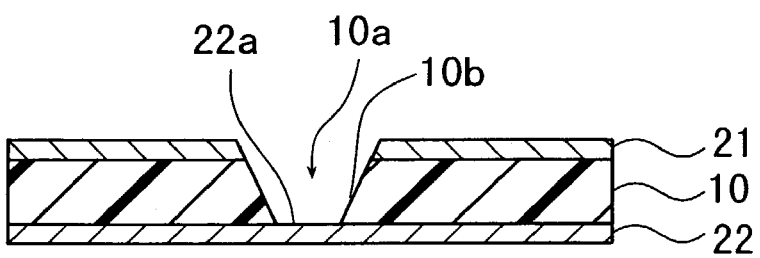

Then, as shown in FIG. 1c, a through-hole 10a is formed by etching the exposed part of polyimide film 10 using an alkaline solution such as a hydrazine or potassium hydroxide solution as an etchant.

Thus, the second copper foil 22 is partially exposed, but the through-hole 10a in polyimide film 10 is closed at one end with part 22a of the second copper foil 22.

Figure 1D:
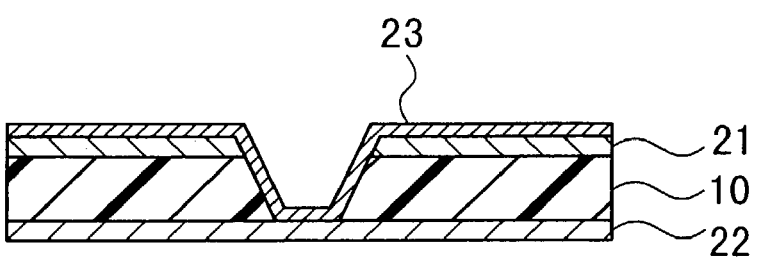

Then, as shown in FIG. 1d, the entire surface on the side of the through-hole 10a in the polyimide film 10 is plated by electroless plating, for example.

Thus, a plating layer 23 is applied on the exposed part 22a of second copper foil 22 forming the bottom of the through-hole 10a, the side wall 10b of through-hole 10a and the surface of the first copper foil 21, so that the first and second copper foils 21, 22 are electrically connected each other.

Figure 1E:
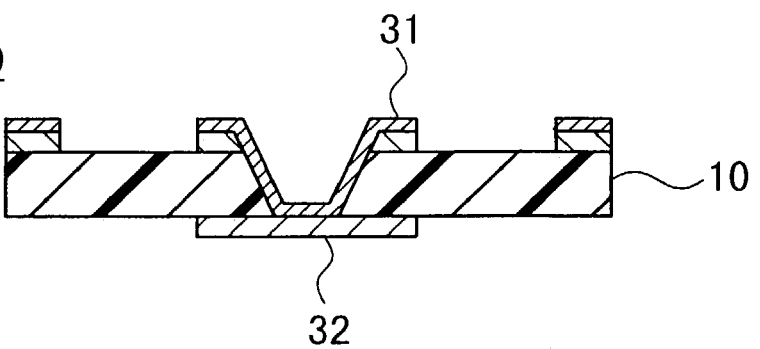

Then, as shown in FIG. 1e, a given pattern is formed in the first and second copper foils 21, 22 by photolithography, for example. Thus, a flexible wiring board for double-side connection (hereinafter referred to as a "flexible wiring board") 30 having a pair of first and second electrodes 31, 32 is obtained.

From the viewpoint of ensuring corrosion resistance, a nickel/gold plating layer not shown may be applied on the surfaces of first and second electrodes 31, 32.

This flexible wiring board 30 is punched out in a given shape for use.

FIGS. 2a-2d are schematic diagrams showing an example of a connection method using a flexible wiring board according to the embodiment of the present invention.

Figure 2A:
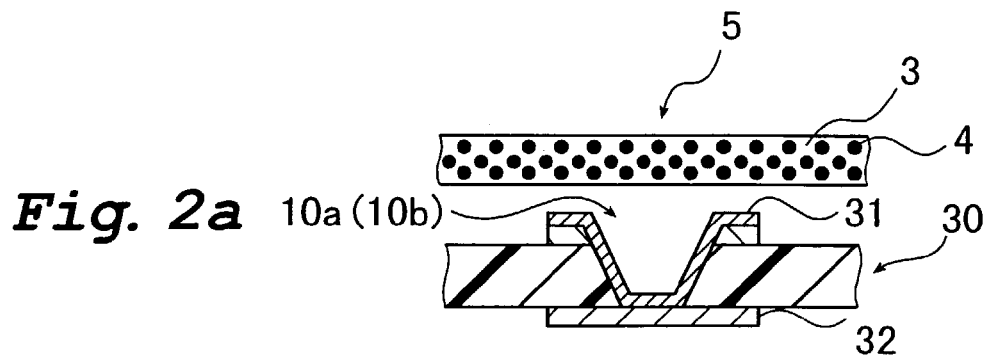
FIGS. 2a-2d are a schematic diagram showing an example of a connection method using a flexible wiring board according to the embodiment of the present invention.

In this embodiment, as shown in FIG. 2a, a flexible wiring board 30, as described above, and an anisotropic conductive adhesive film 5 containing conductive particles 4 dispersed in an insulating adhesive 3 are first prepared.

Figure 2B:
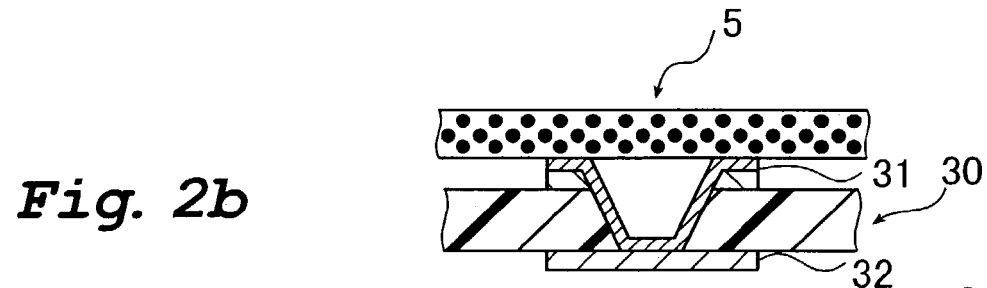

Then, anisotropic conductive adhesive film 5 is applied on the side of opening 10b of through-hole 10a of flexible wiring board 30, as shown in FIGS. 2a and 2b.

Figure 2C:
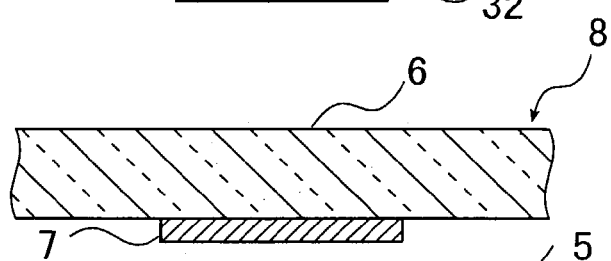
Figure 2C:
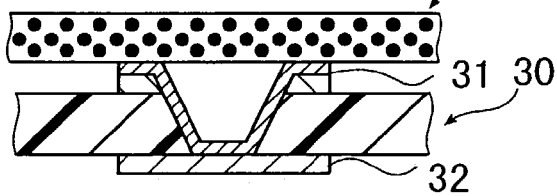

Then, as shown in FIG. 2c, an electric component such as a liquid crystal panel 8 consisting of a glass substrate 6 on which a given electrode pattern 7 is formed, for example, is prepared.

Figure 2D:
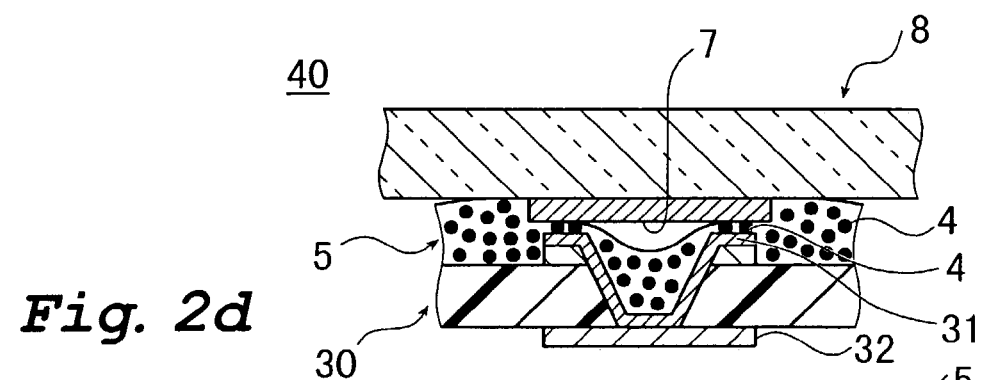
Figure 2D:
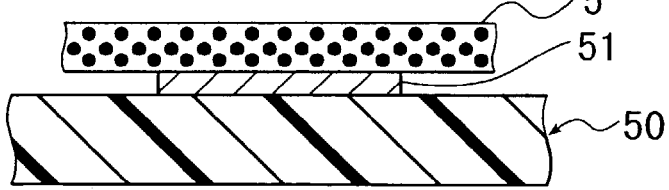

Then, as shown in FIG. 2d, the flexible wiring board 30 is thermo-compression bonded to liquid crystal panel 8 with anisotropic conductive adhesive film 5 inserted therebetween.

Thus, the electrode pattern 7 of the liquid crystal panel 8 and the first electrode 31 of flexible wiring board 30 are electrically connected each other via conductive particles 4 in an anisotropic conductive adhesive film 5 to give an intended electronic component assembly 40.

Then, anisotropic conductive adhesive film 5 is used in the same manner to electrically connect the second electrode 32 of the flexible wiring board 30 and an electrode 51 of a circuit board 50 carrying a given electronic component not shown.

Figure 3:
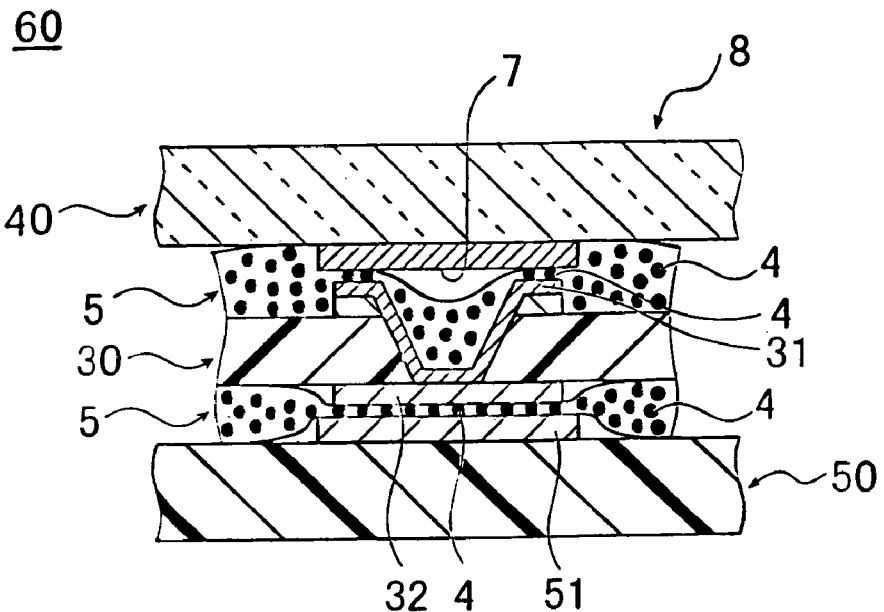
FIG. 3 is a sectional diagram showing the structure of an electronic component assembly according to an embodiment of the present invention.
Figure 4:
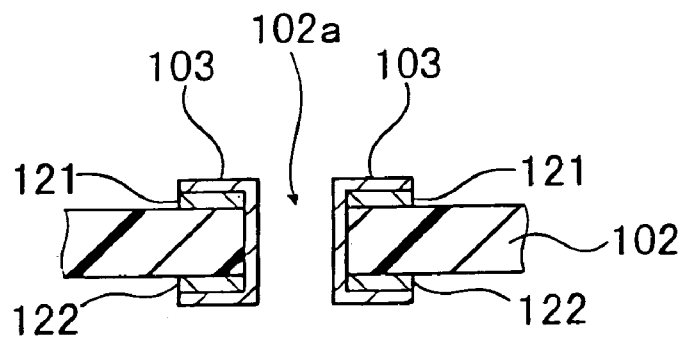
FIG. 4 is a sectional diagram showing the main structure of a conventional flexible wiring board.
Figure 5A:
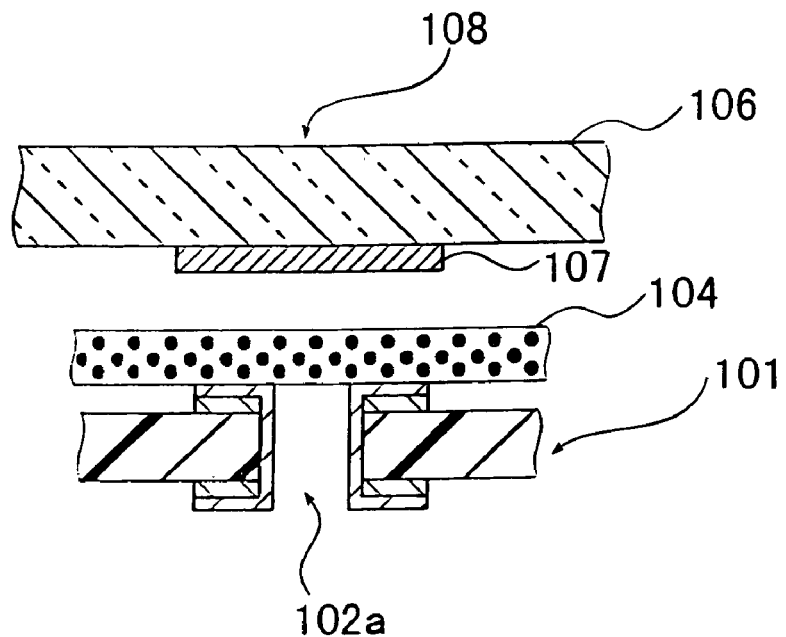
FIGS. 5a-5b are a schematic diagram showing a connection method using the conventional flexible wiring board.
Figure 5B:
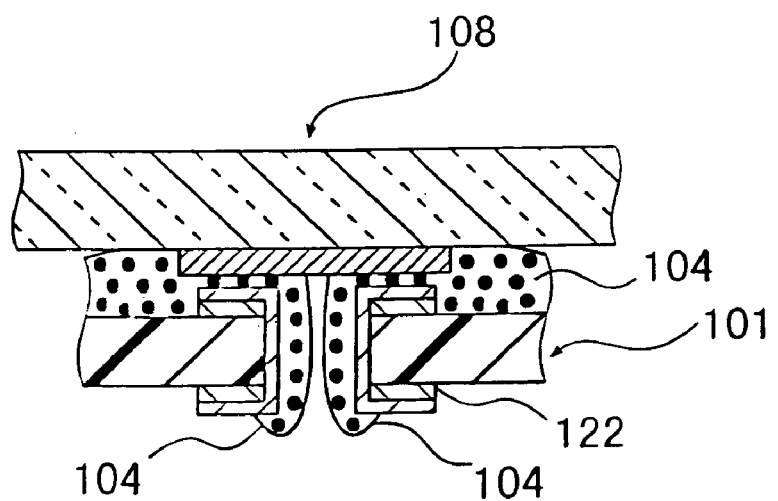

Thus, as shown in FIG. 3, an electronic component assembly 60 in which the electrode pattern 7 of liquid crystal panel 8 and the electrode 51 of the circuit board 50 are electrically connected each other via a flexible wiring board 30 is obtained.

According to this embodiment, a pair of first and second electrodes 31, 32 on both sides of the polyimide film 10 are electrically connected each other with at least one end of the through-hole 10a in the polyimide film 10 being closed as described above, so that the anisotropic conductive adhesive 5 does not run off to the side of the second electrode 32 when the anisotropic conductive film 5 is used to connect the first electrode 31 to an electrode pattern 7 of liquid crystal panel 8, for example.

According to this embodiment, therefore, electric component assemblies 40, 60 with high connection reliability can be obtained without causing smoothness loss or contamination during connection to another circuit board 50.

Also according to the process of this embodiment, a flexible wiring board 30 can be easily and efficiently manufactured.

The present invention is not limited to the foregoing embodiment, but may include various modifications.

For example, the present invention is not limited to the foregoing embodiment in which an electroless plating layer is applied on the entire surface on the side of the first electrode of the flexible wiring board, but electrolytic plating can be performed after applying conductive particles (e.g. graphite, carbon black, conductive polymers such as polyaniline and polypyrrole, palladium) to be conductive on the side wall of the through-hole, for example.

Although polyimide was used as a material for the insulating substrate in the foregoing embodiment, a polyimide precursor can be used and imidated after a through-hole has been formed and patterned.

In the present invention, the flexible wiring board may be punched out after an anisotropic conductive adhesive film has been applied or each piece of an anisotropic conductive adhesive film may be applied after the flexible wiring board has been punched out.

Moreover, the present invention is effective when an anisotropic conductive adhesive in either film or paste form is used.

INDUSTRIAL APPLICABILITY

As described above, flexible wiring boards for double-side connection of the present invention overcome the problem that when an anisotropic conductive adhesive is used to connect one electrode to an electrode of another electric component, the anisotropic conductive adhesive runs off to the side of the other electrode via through-hole to cause smoothness loss or contamination during connection to other circuit boards, so that the reliability of connection to circuit boards can be improved.

What is claimed is:

1. An electric component assembly, comprising:
    a liquid crystal panel having at least one patterned electrode on one side of a substrate,
    a flexible wiring board for double-side connection bonded to the liquid crystal panel with anisotropic conductive adhesive, the flexible wiring board comprising:
        a film-shaped insulating substrate comprising a through-hole at a given location; and
        a first and second electrode, wherein the first and second electrodes are provided at the through-hole closed by at least one of the first and second electrodes on opposite sides of the film-shaped insulating substrate from each other and are electrically connected to one another, the first electrode is made of a plating layer formed on a copper foil layer, and the patterned electrode of the liquid crystal panel is in a straddling position over the opening of the through-hole of the flexible wiring board for double-side connection and connected electrically to the plating layer of the first electrode by conductive particles of the anisotropic conductive adhesive in such a manner that prevents the anisotropic conductive adhesive from flowing through the patterned electrode; and
    a circuit board mounting an electric component,
    wherein the circuit board is bonded to the flexible wiring board with the anisotropic conductive adhesive and an electrode of the circuit board is electrically connected to the second electrode of the flexible wiring board by the conductive particles of the anisotropic conductive adhesive.

2. The electric assembly according to claim 1, wherein the diameter of the conductive particles of the anisotropic conductive adhesive is smaller than the depth of the through-hole of the flexible wiring board.

3. The electric assembly according to claim 1, wherein the patterned electrode of the liquid crystal panel and the first electrode of the flexible wiring board are connected around an opening of the through-hole of the flexible wiring board.

4. A process for manufacturing an electronic component assembly having a flexible wiring board for double-side connection the process comprising:
    fixing a first layer of copper foil to a first side of a film-shaped insulating substrate;
    fixing a second layer of copper foil to a second side of the film-shaped insulating substrate;
    etching a given part of the first layer of copper foil on the film-shaped insulating substrate to form a hole in the first layer of copper foil;
    etching the part of the insulating substrate corresponding to the hole in the first layer of copper foil to form a through-hole, in the film-shaped insulating substrate, wherein the second layer of copper foil remains intact and exposed through the through-hole;
    applying a plating layer on the first layer of copper foil and the through-hole in the insulating substrate to electrically connect the first and second layers of copper foil to each other;
    etching the first layer of copper foil with the plating layer and the second layer of copper foil to form a first and second electrode;
    applying an anisotropic conductive adhesive on the side of opening of the through-hole of the flexible wiring board for double-side connection;
    bonding a liquid crystal panel having at least one patterned electrode on one side of a substrate and the flexible wiring board for double side connection to each other with the anisotropic conductive adhesive,
    wherein the patterned electrode of the liquid crystal panel is in straddling position over the opening of the through-hole of the flexible wiring board for double-side connection and connected electrically to the plating layer of the first electrode of the flexible wiring board by conductive particles of the anisotropic conductive adhesive in such a manner that prevents the anisotropic adhesive from flowing through the patterned electrode; and
    bonding the flexible wiring board for double-side connection and a circuit board having at least one patterned electrode on one side of a substrate to each other with the anisotropic conductive adhesive;
    wherein the electrode of the circuit board is connected electrically to the second electrode of the flexible wiring board by the conductive particles of the anisotropic adhesive.

5. The electric assembly according to claim 4, wherein the diameter of the conductive particles of the anisotropic conductive adhesive is smaller than the depth of the through-hole of the flexible wiring board.

6. The electric assembly according to claim 4, wherein the patterned electrode of the liquid crystal panel and the first electrode of the flexible wiring board are connected around an opening of the through-hole of the flexible wiring board.

* * * * *